(12) United States Patent
King et al.

(10) Patent No.: US 11,278,957 B2
(45) Date of Patent: Mar. 22, 2022

(54) ENERGY STORAGE DEVICES HAVING COATED PASSIVE COMPONENTS

(71) Applicant: FORGE NANO, INC., Louisville, CO (US)

(72) Inventors: David M. King, Sudbury, MA (US); Paul Lichty, Louisville, CO (US)

(73) Assignee: FORGE NANO, INC., Louisville, CO (US)

( * ) Notice: Subject to any disclaimer, the term of this patent is extended or adjusted under 35 U.S.C. 154(b) by 0 days.

(21) Appl. No.: 16/799,229

(22) Filed: Feb. 24, 2020

(65) Prior Publication Data
US 2021/0023616 A1    Jan. 28, 2021

Related U.S. Application Data

(63) Continuation of application No. 16/129,642, filed on Sep. 12, 2018, now Pat. No. 10,569,330, which is a (Continued)

(51) Int. Cl.
*H01G 4/008* (2006.01)
*B22F 1/02* (2006.01)
(Continued)

(52) U.S. Cl.
CPC ............... *B22F 1/025* (2013.01); *B05D 1/00* (2013.01); *B22F 1/0018* (2013.01); *B22F 1/02* (2013.01); *C23C 16/0236* (2013.01); *C23C 16/34* (2013.01); *C23C 16/40* (2013.01); *C23C 16/403* (2013.01); *C23C 16/442* (2013.01); *C23C 16/4417* (2013.01); *C23C 16/45525* (2013.01);
(Continued)

(58) Field of Classification Search
None
See application file for complete search history.

(56) References Cited

U.S. PATENT DOCUMENTS 4,058,430 A    11/1977    Suntola et al.
6,582,763 B1    6/2003    Nishimura et al.
(Continued)

FOREIGN PATENT DOCUMENTS

CN    103050279 A    4/2013
EP    0 865 819 A1    9/1998
(Continued)

OTHER PUBLICATIONS

International Search Report issued in International Patent Application No. PCT/US2015/023550, dated Jul. 16, 2015.
(Continued)

*Primary Examiner* — Dion R. Ferguson
(74) *Attorney, Agent, or Firm* — Frank Rosenberg

(57) ABSTRACT

The present invention provides various passive electronic components comprising a layer of coated particles, and methods for producing and using the same. Some of the passive electronic components of the invention include, but are not limited to conductors, resistors, current collectors, capacitors, piezoelectronic devices, inductors and transformers. The present invention also provides energy storage devices and electrode layers for such energy storage devices having passive, electrically-conductive particles coated with one or more thin film materials.

16 Claims, 9 Drawing Sheets

Related U.S. Application Data continuation-in-part of application No. 15/301,102, filed as application No. PCT/US2015/023550 on Mar. 31, 2015, now Pat. No. 10,081,865.

(60) Provisional application No. 61/973,352, filed on Apr. 1, 2014.

(51) Int. Cl.

| | | |
|---|---|---|
| *B22F 1/00* | (2022.01) | |
| *C23C 16/455* | (2006.01) | |
| *C23C 16/40* | (2006.01) | |
| *H01M 4/36* | (2006.01) | |
| *C23C 18/12* | (2006.01) | |
| *H01G 4/12* | (2006.01) | |
| *C23C 16/44* | (2006.01) | |
| *C23C 16/442* | (2006.01) | |
| *H01G 11/50* | (2013.01) | |
| *C23C 16/34* | (2006.01) | |
| *C23C 16/02* | (2006.01) | |
| *H01G 11/24* | (2013.01) | |
| *H01G 11/30* | (2013.01) | |
| *B05D 1/00* | (2006.01) | |
| *H01M 4/62* | (2006.01) | |
| *H01G 4/30* | (2006.01) | |
| *H01G 11/46* | (2013.01) | |
| *H01G 4/33* | (2006.01) | |

(52) U.S. Cl.
CPC .... *C23C 16/45555* (2013.01); *C23C 18/1216* (2013.01); *H01G 4/008* (2013.01); *H01G 4/0085* (2013.01); *H01G 4/1227* (2013.01); *H01G 11/24* (2013.01); *H01G 11/30* (2013.01); *H01G 11/50* (2013.01); *H01M 4/366* (2013.01); *H01M 4/62* (2013.01); *H01G 4/30* (2013.01); *H01G 4/33* (2013.01); *H01G 11/46* (2013.01)

(56) References Cited

U.S. PATENT DOCUMENTS

| | | |
|---|---|---|
| 6,592,938 B1 | 7/2003 | Pessey et al. |
| 7,521,086 B2 * | 4/2009 | Cansell ................ C04B 35/117 427/215 |
| 9,318,264 B2 | 4/2016 | Chung et al. |
| 10,081,865 B2 | 9/2018 | King et al. |
| 2001/0048969 A1 | 12/2001 | Constantino et al. |
| 2002/0039272 A1 * | 4/2002 | Mizuno ................ H01G 4/232 361/311 |
| 2002/0150777 A1 | 10/2002 | Kerchner et al. |
| 2003/0118723 A1 | 6/2003 | Araki et al. |
| 2005/0194573 A1 | 9/2005 | Yamashita |
| 2005/0262966 A1 | 12/2005 | Chandler et al. |
| 2010/0110608 A1 * | 5/2010 | Wei ...................... H01G 4/1209 361/321.4 |
| 2010/0327237 A1 | 12/2010 | Takai et al. |
| 2011/0236575 A1 | 9/2011 | King et al. |
| 2011/0275163 A1 | 11/2011 | Ahn et al. |
| 2011/0284962 A1 | 11/2011 | Chang et al. |
| 2012/0125670 A1 | 5/2012 | Kato et al. |
| 2012/0216713 A1 | 8/2012 | Cheema et al. |
| 2013/0038983 A1 * | 2/2013 | Kim ........................ H01B 1/16 361/321.1 |
| 2013/0050901 A1 | 2/2013 | Lee et al. |
| 2013/0078510 A1 | 3/2013 | Reynolds et al. |
| 2013/0141835 A1 * | 6/2013 | Hwang .................... H01G 4/30 361/305 |
| 2014/0099554 A1 | 4/2014 | Inoue et al. |
| 2014/0127567 A1 | 5/2014 | Kuriki et al. |
| 2016/0164079 A1 | 6/2016 | Bae et al. |

FOREIGN PATENT DOCUMENTS

| | | |
|---|---|---|
| JP | 2000-509703 A | 8/2000 |
| JP | 2000-282102 A | 10/2000 |
| JP | 2003-527291 A | 9/2003 |
| JP | 2005-501176 A | 1/2005 |
| JP | 2008-095184 A | 4/2008 |
| JP | 2011-197569 A | 10/2011 |
| JP | 2013-028484 A | 2/2013 |
| JP | 2013-075357 A | 4/2013 |

OTHER PUBLICATIONS

Notice of Reasons for Rejection issued in related Japanese Patent Application 2016-560795 dated Nov. 26, 2019.

* cited by examiner

| 12hr @ 300°C Dwell | Nickel | NiO |
|---|---|---|
| Control, as received | 99.9% | 0.1% |
| Control, Heat Treated | 83.4% | 16.6% |
| Nanocoated Nickel, Below critical thickness | 89.5% | 10.5% |
| Nanocoated Nickel, At Critical thickness | 99.8% | 0.2% |

FIGURE 6

ENERGY STORAGE DEVICES HAVING COATED PASSIVE COMPONENTS

CROSS REFERENCE TO RELATED APPLICATIONS

This application is a Continuation of U.S. patent application Ser. No. 16/129,642, filed Sep. 12, 2018, which is a Continuation-in-Part of U.S. patent application Ser. No. 15/301,102, filed Sep. 30, 2016, which is the National Phase of International Patent Application No. PCT/US2015/023550, filed Mar. 31, 2015, published on Oct. 8, 2015 as WO 2015/153584, which claims priority to U.S. Provisional Application No. 61/973,352, filed Apr. 1, 2014. The contents of these applications are herein incorporated by reference in their entirety.

FEDERAL FUNDING STATEMENT

This Invention was made with government support under Contract No. DE-SC0010239 awarded by the Department of Energy. The Government has certain rights in this invention.

FIELD OF THE INVENTION

The present invention relates to various passive electronic components comprising a layer of coated nanoparticles, and methods for producing and using the same. In particular, the present invention relates to energy storage devices having the passive components.

BACKGROUND OF THE INVENTION

The incorporation of particles from millimeter-scale down to nanometers in size is ubiquitous in end-use products produced in industrial-scale quantities. A significant percentage of the particles used across all industries require that the surfaces be coated with a shell, layer, film, or other coating, ranging from sub-nanometer to hundreds of micrometers in thickness. For a variety of reasons, each sector or industry has determined that the incorporation of coated particles into the end-use product provides enough value, e.g., in the form of enhanced performance of the product, that the cost associated with each coating process is justified. Energy storage is one application where nanoscale coatings can significantly improve the uniformity and compatibility of surfaces, allowing for preferential transfer of beneficial ions or electrons across interfaces, while reducing the propensity for detrimental or corrosion promoting species from degrading or otherwise altering these interfaces.

The performance of passive electronic components such as capacitor technologies, including single-layer or multi-layered ceramic capacitors (MLCC), electrolytic capacitors, polymer film capacitors, or emerging ultracapacitor and/or supercapacitor systems, relies on the quality of control across interfaces, which in turn defines the specification for capacitance, dielectric strength, breakdown voltage, dielectric loss, etc. Mechanisms to tailor and optimize all surfaces of all materials contained within the system leads to better control, definition, functionality or other specification of performance of any feature of each system.

Ceramic capacitors (bulk ceramic and MLCCs) have existed for quite some time, and the state of the art has progressively advanced to higher energy density, power density, lifetime/durability, and similar advances, all while occupying a decreasing footprint that trends with smaller sizes of integrated circuit technologies. Barium titanate ($BaTiO_3$) is a commonly used dielectric material. Extensive work on this material has demonstrated that tailored bulk content (e.g., dopants, protonation, etc.) or utilization of surface coatings (e.g., $Al_2O_3$, $SiO_2$, etc.) can be used to achieve higher breakdown voltages than untreated materials. Constantino et al. (U.S. Patent Application Publication No. 2001/0048969) discusses $Al_2O_3$-coated or $SiO_2$-coated sub-micron $BaTiO_3$ particles that are exemplary of these additional performance features. Many other tactics have been used to modify dielectric materials to achieve improved device properties.

Methods of producing compositionally-tailored ceramic/dielectric layers themselves using additive, layer-by-layer controlled techniques, even those as precise as Atomic Layer Epitaxy or Atomic Layer Deposition as described by Suntola et al. (U.S. Pat. No. 4,058,430), have been deployed to achieve similar effects (see, for example, Ahn, et al., U.S. Patent Application Publication No. 2011/0275163). In addition, techniques that cast or otherwise form a bulk layer consisting of a plurality of compositionally-tailored coated dielectric particles have also been described. See, for example, Constantino et al. in U.S. Patent Application Publication No. 2001/0048969. Coating processes for particles as precise as Atomic Layer Deposition is described by Lakomaa, et al. in the seminal demonstration of ALD coated particles: "Atomic layer growth of $TiO_2$ on silica", *Applied Surface Science* 60/61 (1992) 742-748.

Several years after the seminal publication of conformal metal oxide coatings on microfine powders (produced using sequential self-limiting gas phase reactions that occurred homogeneously on the surfaces of particles in a fixed bed of particles enclosed in a single batch reactor), additional patents have been issued pertaining to ALD and non-ALD techniques for producing high quality coatings on particles, including nanoparticles. As examples included herein by reference, Krause et al. (EP 0865819) discuss methods of encapsulating particles using fluidized beds; Cansell et al. (U.S. Pat. No. 6,592,938) discuss methods of coating particles using organometallic precursors that are individually known to undergo self-limiting reactions under traditional ALD conditions. Cansell further discusses (see U.S. Pat. No. 7,521,086) as to how the latter coating technique could similarly be utilized for the production of a metal oxide encapsulated $BaTiO_3$.

As described by King et al. (US 20110236575), vapor deposition processes are usually operated batch-wise in reaction vessels such as fluidized bed reactors, rotary reactors and V-blenders, amongst others. Batch processes have significant inefficiencies when operated at large scale. One of the disadvantages of batch processes is that the reactor throughput is a function of the total particle mass or volume loaded into a certain sized vessel for a given process, the total process time (up-time), and the total time between processes (down-time) to load, unload, clean, prepare, etc. In addition, batch processes incur large down-times because at the end of each batch the finished product must be removed from the reaction equipment and fresh starting materials must be charged to the equipment before the subsequent batch can be produced. Equipment failures and maintenance add to this downtime in batch processes.

Moreover, relatively speaking, batch process equipment tends to be very large and expensive. The need to operate these processes under vacuum adds greatly to equipment costs, especially as equipment size increases. Because of this, equipment costs for batch processes tend to increase faster than operating capacity.

Another problem that occurs as the process equipment becomes larger is that it becomes more difficult to maintain uniform reaction conditions throughout the vessel. For example, temperatures can vary considerably within a large reaction vessel. It is also difficult to adequately fluidize a large mass of particles, specifically nanoparticles. Issues such as these can lead to inconsistencies and defects in the coated product.

In vapor deposition processes such as ALD and Molecular Layer Deposition (MLD), the particles are contacted with two or more different reactants in a sequential manner. This represents yet another problem for a batch operation. For a traditional batch process, all cycles are performed sequentially in a single reaction vessel. The batch particle ALD process incurs additional down-time due to more frequent periodic cleaning requirements, and the reaction vessels cannot be used for multiple film types when cross-contamination could be problematic. In addition, the two sequential self-limiting reactions may occur at different temperatures, requiring heating or cooling of the reactor between cycle steps in order to accommodate each step.

The throughput for a batch process can be increased either by building larger reaction vessels and/or operating identical reaction vessels in parallel. The capital cost to counteract this down-time from a throughput perspective is to build a larger reaction vessel. With larger vessels, localized process conditions, including internal bed heating, pressure gradients, mechanical agitation to break up nanoparticle aggregates, and diffusion limitations amongst others, become more difficult to control.

Furthermore, there is a practical maximum reaction vessel size when performing ALD processes on fine and ultra-fine particles, which limits the throughput for a single batch reactor operating continually. In general, the time duration for the process of producing a given amount of coated materials equals the up-time plus down-time. There is also a practical maximum allowable in capital expense to fabricate an ALD-coated particle production facility, which effectively limits the number of batch reactors that can operate identical processes in parallel. With these and other constraints, there are practical throughput limitations that prohibit the integration of some particle ALD processes at the industrial scale.

King et al. (U.S. Patent Application Publication No. 2011/0236575) discusses a high-rate "Spatial ALD" manufacturing process and apparatus for coating particles in semi-continuous fashion using an array of isolated vessels with counter-current gas-solids transport. As described in King et al., one example where a semi-continuous coated particle manufacturing process is desirable is a facility that utilizes particle ALD to produce fine or ultra-fine passivated titanium dioxide particles used as pigments in paints, plastics, paper, etc. Another example is a facility that utilizes particle ALD to produce coated fine or ultra-fine particles for cathodes, anodes, dielectrics, metals, polymers, semiconductors and other ceramics for integration into power systems devices including, but not limited to, batteries, capacitors, varistors, thyristors, inverters, transistors, light emitting diodes and phosphors, photovoltaic, and thermoelectric devices. Particle ALD produced powders for the pigment and power systems industries can significantly improve the performance of the end-use products, which can be cost competitive if produced at high annual throughputs.

Van Ommen et al. (U.S. Patent Application Publication No. 20120009343) discusses another high-rate "Spatial ALD" process and apparatus to coat particles in a fully continuous co-current gas-solids transport scheme. Each of these methods has its own ascribed operating cost. These methods are suitable for the manufacture of particular coated particles. In addition, each of these methods is believed to be superior and economically more viable to traditional batch (or "temporal") ALD coating methods. Fotou et al. (Sequential Gas-Phase Formation of $Al_2O_3$ and $SiO_2$ Layers on Aerosol-Made $TiO_2$ Particles" *Advanced Materials* (1997), 9, No. 5, 420-423) discuss methods of producing nanocoatings on submicron particles by exposing reactive precursors to the surfaces of particles using continuous-flow Chemical Vapor Deposition techniques. However, the consistency, uniformity and thickness do not lend themselves easily to less than 5 nm coatings on submicron-sized particles.

It is expected that a thin film coating (e.g., 5 nm or less) on nanoparticles that are used in passive electronic components will provide a significant protection from degradation and/or oxidation of nanoparticles while maintaining substantially all of its electronic function.

Accordingly, there is a need for thin film coated nanoparticles and methods for producing and using the same in passive electronic components.

SUMMARY OF THE INVENTION

Some aspects of the invention provide a passive electronics component comprising nanoparticles that are coated with a thin film of material. The thin film coating can be an oxidation-resistant material or a reliability-improving material. As used herein, the term "reliability-improving materials" refers to materials that can improve the performance and/or the life span or mean time to failure of the passive electronics component compared to the same passive electronics component in the absence of the thin film coating. In one particular instance, the reliability-improving materials increase the performance of the passive electronics component by at least 10%, typically by at least 25%, and often by at least 100%. compared to the same passive electronics component in the absence of the thin film coating. In another instance, the reliability-improving materials increase the mean time to failure of the passive electronics component by at least 20%, typically by at least 50%, and often by at least 200% relative to the same passive electronics component in the absence of the thin film coating.

As used herein, the terms "same passive electronics component in the absence of the thin film coating" and "similar passive electronics components in the absence of the thin film coating" are used interchangeably herein and refer to the electronics component that is produced using the same material and same process except for the absence of the thin film coating.

In one aspect, disclosed herein is an electrode layer for an energy storage device which includes active and passive components, wherein the electrode layer includes passive, electrically-conductive particles coated with a thin film of protective material. In at least one embodiment, the function of the electrode layer may be substantially the same to a similar electrode layer of passive, electrically-conductive particles in the absence of the protective material.

In at least one embodiment, the passive, electrically-conductive particles are metallic and/or polymeric. In at least one embodiment, the metallic and/or polymeric particles include aluminum, platinum, silver, gold, titanium, copper, zinc, chromium, nickel, iron, molybdenum, tungsten, ruthenium, palladium, indium, PtNi, FeCrAlY, AgPd, nichrome, other conductive steels, PEDOT, other conductive polymers, or combinations thereof. In at least one embodiment, the passive, electrically-conductive particles include carbons, carbon black, acetylene black, activated carbon, carbon nanotubes, carbon fibers, vapor grown carbon fibers, carbon nanoribbons, graphite, graphene, diamond or diamond like carbon, and combinations thereof. In at least one embodiment, the energy storage device includes a battery, a single-layer capacitor, multi-layer capacitor or an ultracapacitor.

In at least one embodiment, the electrode layer is produced from a casting, printing or spraying process. In at least one embodiment, the electrically-conductive particles have a median particle size of 3,000 nanometers or less. In at least one embodiment, the thin film of protective material has a thickness of about 20 nanometers or less.

Exemplary thin film protective material include, but not limited to, aluminum oxide, hafnium oxide, zirconium oxide, tantalum oxide, niobium oxide, lithium oxide, silicon oxide, calcium oxide, magnesium oxide, boron oxide, aluminum phosphate, titanium phosphate, lithium phosphate, calcium phosphate, aluminum nitride, gallium nitride, boron nitride, boron carbide, zinc oxide, titanium oxide, cerium oxide, vanadium oxide, barium oxide, bismuth oxide, ruthenium oxide, indium oxide, tin oxide, lanthanum oxide, titanium nitride, tantalum nitride, silicon carbide, and binary, ternary or quaternary combinations thereof. In at least one embodiment, the thin film of protective material is produced using atomic layer deposition, molecular layer deposition, chemical vapor deposition, or combinations thereof.

In at least one embodiment, the lifetime of an electrode layer comprising thin film protected electrically-conductive particles is at least 10% more than an electrode layer with uncoated electrically-conductive particles. In at least one embodiment, the rate capability of an electrode layer comprising thin film protected electrically-conductive particles is at least 10% more than an electrode layer with uncoated electrically-conductive particles.

In yet another aspect, disclosed herein is an energy storage device comprising an electrode layer having passive, electrically-conductive particles, wherein the electrically-conductive particles comprise one or more of copper, nickel or aluminum, and wherein the electrically-conductive particles are coated with one or more thin film protective materials. In at least one embodiment, the coating on the electrically-conductive particles is produced using an atomic layer deposition or a molecular layer deposition process. The energy storage device may have a resistivity value less than 10,000 µΩ-cm, produced using atomic layer deposition or molecular layer deposition.

In one particular aspect of the invention, the passive electronics component comprises an electrode layer of electric conducting nanoparticles. The nanoparticles of the invention are coated with a thin film of oxidation-resistant material. The thin film of oxidation-resistant material prevents oxidation of the nanoparticles while maintaining the function of the electrode layer substantially the same as that of a similar electrode layer of electric conducting nanoparticles in the absence of said thin film of oxidation-resistant material. As used herein, the term "similar electrode layer" refers to an electrode layer that is produced in identical conditions except for the absence of the thin film of oxidation-resistant material. The term "nanoparticles" refers to particles having average or median particle size of 1000 nm or less, typically 500 nm or less, often 400 nm or less, and most often 250 nm or less. Alternative, the term "nanoparticles" refers to particles in which 80% or more, typically 90% or more and often 95% or more of the particles have the particle size of 1000 nm or less, typically 800 nm or less, and often 600 nm or less. As used herein, the term "thin film" refers to a film or a coating of a material having mean or median thickness of about 20 nm or less, typically 10 nm or less, often 5 nm or less, and most often 3 nm or less. Alternatively, the term "thin film" refers to a film of from about 2 to about 6 nm in thickness. Still alternatively, the term "thin film" refers to a mono-atomic or molecular layer of coating material. Often, the term "thin film" refers to the thickness of a coating material achieved using the process disclosed in a commonly assigned U.S. patent application Ser. No. 13/069,452, entitled "Semi-Continuous Vapor Deposition Process For The Manufacture of Coated Particles." In general, the thin film is formed by an atomic layer deposition process, which can be carried out in a batch mode, semi-continuous mode, continuous mode, or a combination thereof. It should be appreciated that the thin film can also be formed using any of the methods known to one skilled in the art.

In some embodiments, the thin film of oxidation-resistant material provides no significant additional resistivity to said nanoparticles. The term "no significant additional resistivity" refers to a resistivity of a coated nanoparticle, which first has its native oxide removed prior to coating, whose resistivity differs from the resistivity of uncoated nanoparticle of same composition, without the native oxide being removed, by no more than about 20%, typically no more than about 10%, and often no more than about 5%.

Yet in other embodiments, the thin film of oxidation-resistant material does not significantly affect the sintering of said nanoparticles. As used herein, the term "sintering" refers to atomistic diffusion between nanoparticle and the thin film or atomistic diffusion between nanoparticles. Also as used herein, the term "does not significantly affect the sintering of said nanoparticles" means the amount of sintering or the sintering temperature in the presence of the thin film coating is substantially similar to the amount of sintering or the sintering temperature of the same nanoparticles in the absence of a thin film coating. Generally, the amount of nanoparticle sintering in the presence of the thin film coating is no more than 15%, typically no more than 10%, and often no more than 5% different compared to the amount of nanoparticle sintering in the absence of the thin film coating. Alternatively, the sintering temperature in the presence of the thin film coating is within 50° C., typically within 30° C., and often within 20° C. of the nanoparticle sintering temperature in the absence of the thin film coating.

Still in other embodiments, the thin film of oxidation-resistant material comprises a thin film of wide bandgap material. As used herein, the term "wide bandgap material" refers to materials with electronic band gaps significantly larger than 1.5 electron volt (eV), typically larger than 3.0 eV, and often larger than 5.0 eV. In some instances, the wide bandgap material comprises a material selected from the group consisting of aluminum oxide, hafnium oxide, zirconium oxide, tantalum oxide, niobium oxide, lithium oxide, silicon oxide, calcium oxide, magnesium oxide, boron oxide, aluminum phosphate, titanium phosphate, lithium phosphate, calcium phosphate, aluminum nitride, gallium nitride, boron nitride, boron carbide, and a combination thereof. Still in other instances, the thickness of the thin film coating of wide bandgap material is 8 nm or less, typically 5.5 nm or less, and often 3.5 nm or less.

In other embodiments, the thin film of oxidation-resistant material comprises a thin film of semiconducting or conducting material. Exemplary semiconducting or conducting materials that are suitable for the present invention include, but are not limited to, zinc oxide, titanium oxide, cerium oxide, vanadium oxide, barium oxide, bismuth oxide, ruthenium oxide, indium oxide, tin oxide, lanthanum oxide, titanium nitride, tantalum nitride, silicon carbide, and ternary or quaternary combinations that include these and other analogous materials. Exemplary conducting materials that are useful in the present invention include, but are not limited to, metals (such as platinum, silver, gold, titanium, copper, zinc, chromium, nickel, iron, molybdenum, tungsten, ruthenium, palladium, indium, and tin), alloys or intermetallics (such as PtNi, FeCrAlY, AgPd, nichrome, and other conductive steels) and other electric conducting materials such as those containing carbon (including carbons, carbon black, acetylene black, activated carbon, carbon nanotubes, carbon fibers, vapor grown carbon fibers, carbon nanoribbons, graphite, graphene, diamond and diamond like carbon, and PEDOT and other conductive polymers).

In other embodiments, suitable thin film of protective material may include one or more materials selected from aluminum oxide, hafnium oxide, zirconium oxide, tantalum oxide, niobium oxide, lithium oxide, silicon oxide, calcium oxide, magnesium oxide, boron oxide, aluminum phosphate, titanium phosphate, lithium phosphate, calcium phosphate, aluminum nitride, gallium nitride, boron nitride, boron carbide, zinc oxide, titanium oxide, cerium oxide, vanadium oxide, barium oxide, bismuth oxide, ruthenium oxide, indium oxide, tin oxide, lanthanum oxide, titanium nitride, tantalum nitride, silicon carbide, or the like, and binary, ternary or quaternary combinations thereof.

In one particular embodiment, the resistivity of the thin film of oxidation-resistant material or the coating is 50,000 $\mu\Omega$-cm or less, typically 5,000 $\mu\Omega$-cm or less, and often 500 $\mu\Omega$-cm or less. In at least one embodiment, the electrically-conductive coatings may have a resistivity value less than 10,000 $\mu\Omega$-cm.

Yet in other embodiments, the thin film of oxidation-resistant material comprises a dopant material. Exemplary dopant materials that are useful in the invention include, but are not limited to, +5 valence materials into +4 valence materials (such as tantalum oxide doped into titanium oxide), +3 valence materials into +2 valence materials (such as aluminum oxide doped into zinc oxide), and commonly known doped transparent conductive oxides (such as fluorine-doped tin oxide). Typically, the dopant material increases the conductivity of the thin film of oxidation-resistant material by at least 20%, often by at least 50% and most often by at least 100%.

Still in other embodiments, a thermal oxidation onset temperature of the nanoparticles with the thin film coating is at least 10° C., typically at least 25° C., and often at least 100° C. higher than the same nanoparticles in the absence of said thin film of oxidation-resistant material.

Yet still in other embodiments, the average particle size of said nanoparticles is 1,000 nm or less, typically 800 nm or less, and often 500 nm or less.

Depending on a particular application, the passive electronics component can comprise a plurality of said electrode layers.

Another aspect of the invention provides a passive electronics component comprising a dielectric or piezoelectric layer of corresponding nanoparticles that are coated with a thin film of a reliability-improving material. In this aspect of the invention, the nanoparticles are dielectric or piezoelectric nanoparticles. Exemplary dielectric or piezoelectric materials that are useful in the present invention include nanoparticles composed of materials including, but are not limited to, barium titanate, strontium titanate, barium strontium titanate, barium niobate, strontium niobate, barium strontium niobate, sodium niobate, potassium niobate, sodium potassium niobate, titania, zirconia, lead zirconate, lead zirconate titanate, calcium copper titanate, bismuth scandium oxide, bismuth zinc oxide, bismuth titanate, bismuth zinc titanate, zinc oxide, and zinc titanate.

In some embodiments, the reliability-improving material comprises $SiO_2$, $ZrO_2$, $B_2O_3$, $Bi_2O_3$, $Li_2O$, or a mixture thereof.

Still in other embodiment, the thin film coating reduces the densification onset temperature of said nanoparticles. As used herein, the term "densification" means atomistic diffusion between or within the thin films, and/or interactions with additional densification aids (such as glass or glass-forming powders) present in the system, as relevant. Also as used herein, the "densification onset temperature" means the temperature at which nanoparticles coated with thin films begin to densify and reduce the void space present between a plurality of said nanoparticles. The densification temperature of nanoparticles in the absence of a thin film coating is the same as the sintering temperature of the nanoparticles. Alternatively, the thin film coating serves as a solid precursor to liquid phase sintering of the nanoparticles, at temperatures substantially lower than the traditional sintering temperature of said nanoparticles. In general, the densification temperature of the nanoparticles is at least 25° C. lower, typically by at least 50° C. lower, and often by at least 100° C. lower than the sintering temperature of the same nanoparticles in the absence of the thin film coating.

In one particular embodiment, said nanoparticles comprise barium titanate, and said reliability-improving material comprises an oxide of a metal comprising bismuth, zinc, titanium, scandium, or a mixture thereof. In some instances within this embodiment, said reliability-improving material comprises zinc titanium oxide, bismuth zinc titanium oxide or bismuth scandium oxide.

In another embodiment, said nanoparticles comprise an alkali niobate perovskite, and said reliability-improving material comprises an oxide of a metal selected from the group consisting of tantalum, sodium, potassium, or a mixture thereof. In some instances within this embodiment, said reliability-improving material comprises an alkali tantalate.

Yet in another particular embodiment, said reliability-improving material increases the mean time to failure by at least 10% relative to the same passive electronics component in the absence of said thin film of reliability-improving material.

Still in another particular embodiment, said thin film of reliability-improving material reduces the average grain size of said nanoparticles by at least 20 nm, typically by at least 50 nm, and often by at least 100 nm when fired into fully-dense parts.

As stated above, the thin film coating in some embodiments is produced at least in part using an atomic layer deposition or molecular layer deposition process.

The scope of the invention also includes a passive electronics component comprising a plurality of said dielectric or piezoelectric layers.

Still another aspect of the invention provides a passive electronics component comprising a dielectric and/or piezoelectric layer described herein in combination with an electrode layer comprising electric conducting nanoparticles described herein. That is said nanoparticles of said dielectric and/or piezoelectric layer are coated with a thin film of a reliability-improving material and/or said electric conducting nanoparticles are coated with a thin film of oxidation-resistant material.

Other aspects of the invention include an electronic device comprising a passive electronics component disclosed herein such as one or more electrode layer(s), dielectric layer(s), and/or piezoelectric layer(s).

One specific aspect of the invention provides a capacitor comprising a thin film coated nanoparticles, wherein said thin film coated nanoparticles comprise an electric conducting nanoparticles that are coated with a thin film of an oxidation-resistant material, and wherein said thin film prevents oxidation and sintering of but substantially maintains the electric conductivity property of said nanoparticles. In some embodiments, said oxidation-resistant material comprises a wide bandgap material. In some embodiments, said capacitor is a multilayered ceramic capacitor or MLCC.

BRIEF DESCRIPTION OF THE DRAWINGS

FIG. 6—Thermal stability testing of uncoated and coated electrode-grade nickel nanoparticles at 300° C. for 12 hours, designed to mimic a binder burn-out process in air. The uncoated nickel nanopowder originally had 0.1% NiO by weight, and oxidized to 16.6% NiO after the 12 hour dwell period. A sub-critical ALD coating thickness was used for the test, and reduced the amount of oxidation to 10.5%. The optimal coating thickness identified, which was twice as thick as the sub-critical ALD coating thickness, effectively prevented all oxidation while allowing a binder burn-out process to occur at 300° C. in air rather than a conventional temperature of 270° C. in air.

DETAILED DESCRIPTION OF THE INVENTION

Figure 1:
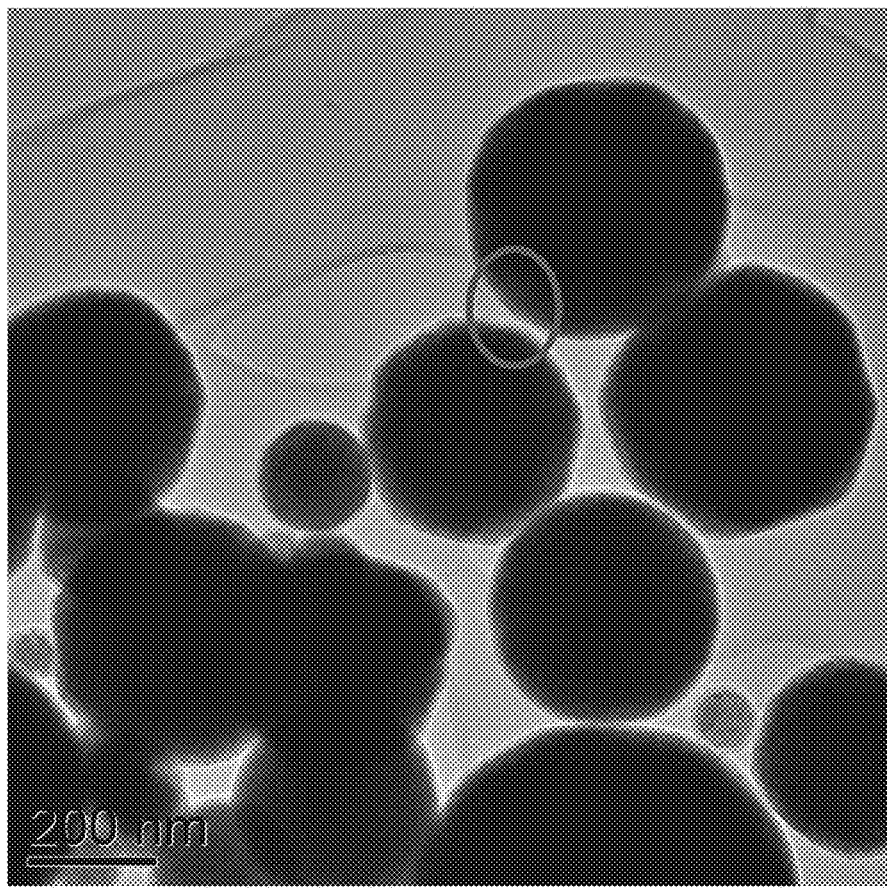
FIG. 1—A transmission electron microscope (TEM) image of an exemplary set of coated electrode-grade nickel nanoparticles with limited (~5-10%) agglomeration. Particles ranged from ~50 nm to ~600 nm in this sample.
Figure 2:
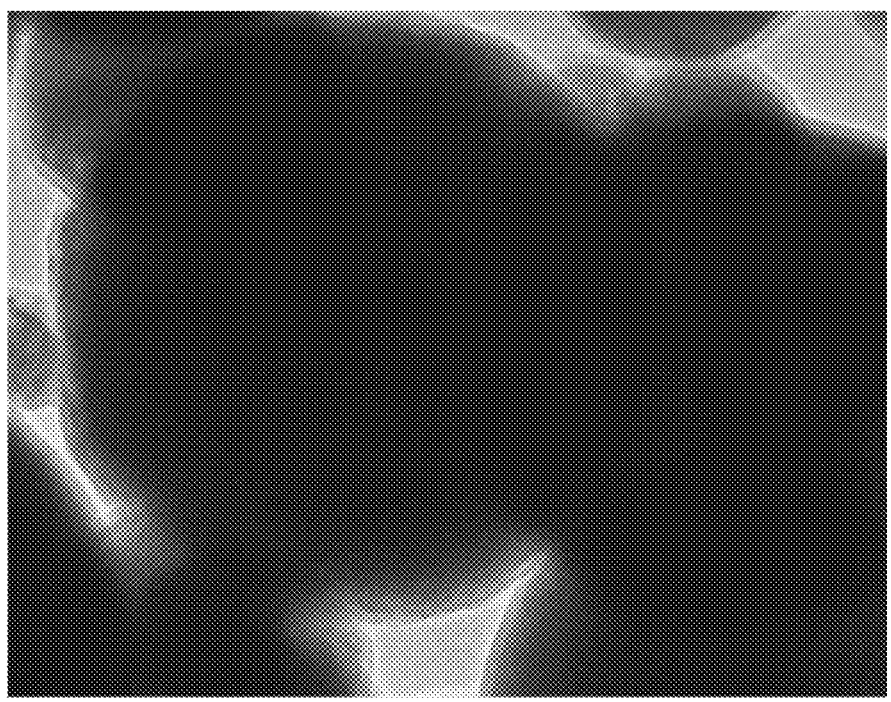
FIG. 2—A magnified TEM image of the lower left portion of FIG. 1, showing coated particles that had agglomerated during the ALD coating process using a batch fluidized bed reactor.
Figure 3:
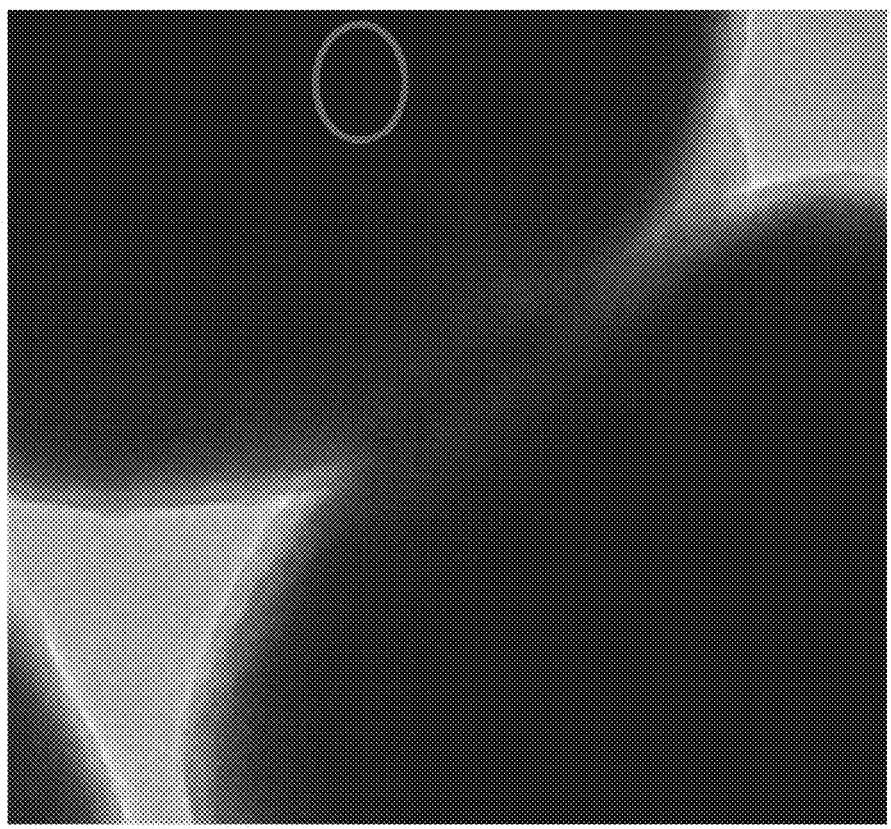
FIG. 3—A magnified TEM image from the upper right portion of FIG. 1, showing coated particles that have necked together during the ALD coating process using a batch fluidized bed reactor.
Figure 4:
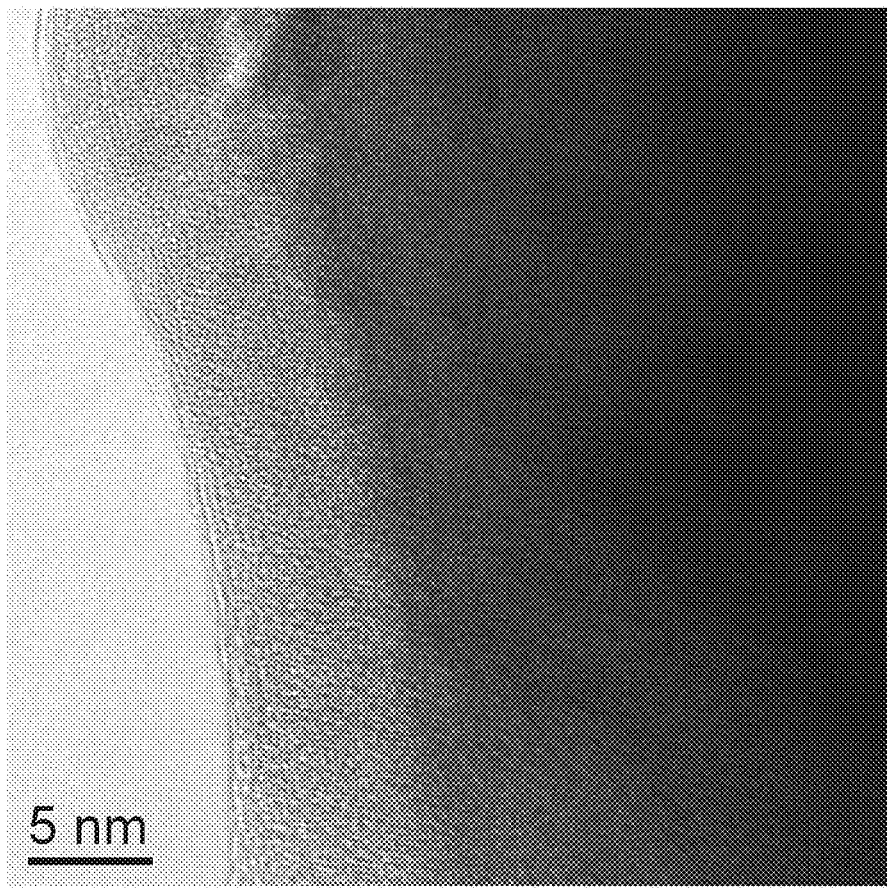
FIG. 4—A high resolution TEM image of an exemplary ~7 nm coating on an electrode-grade nickel nanoparticle.
Figure 5:
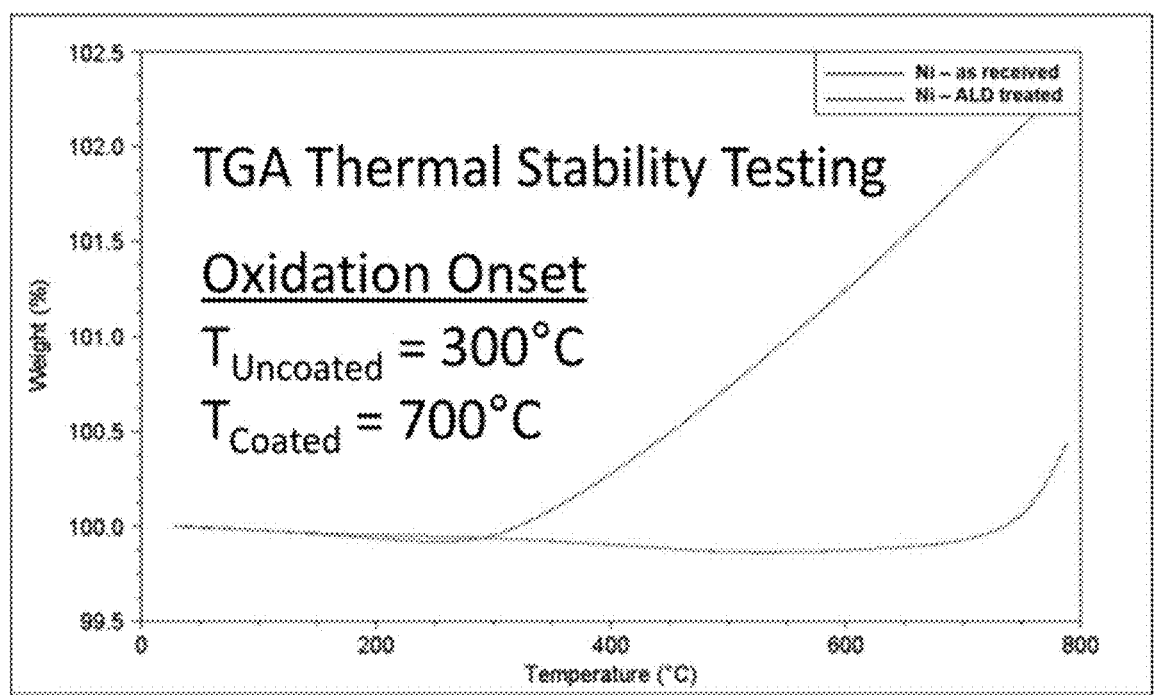
FIG. 5—Thermal gravimetric analysis (TGA) thermal stability testing of uncoated and coated electrode-grade nickel nanoparticles in air. The weight was measured continuously while the temperature was increased at a 10° C./min rate. The uncoated material began to increase in weight, which is indicative of the onset of nickel oxidation, at 300° C.; the coated material began to increase in weight at 700° C.
Figure 7:
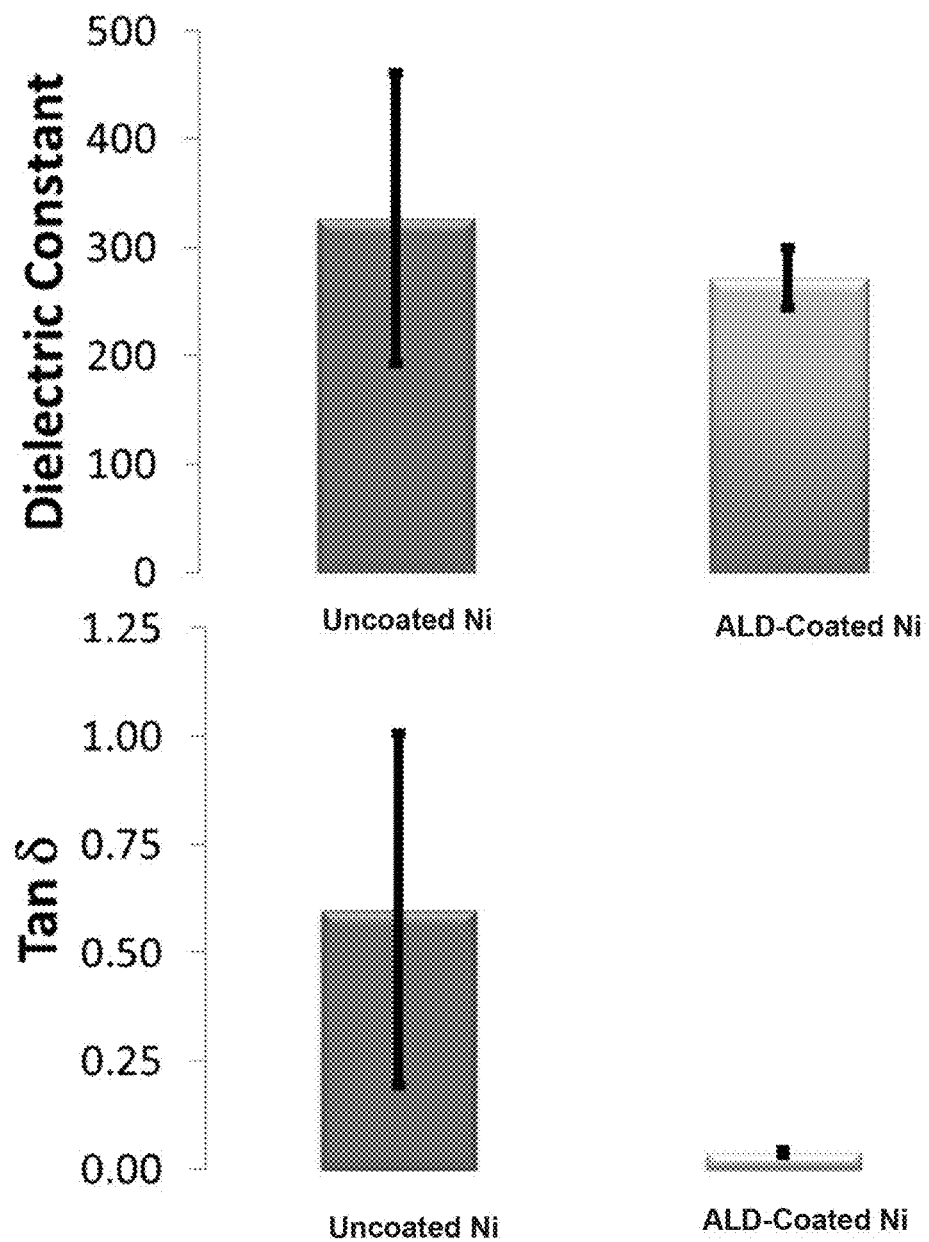
FIG. 7—Dielectric constant and loss (tan delta) measurements for alkali niobate-nickel nanopowder co-fired capacitors produced with uncoated and coated nickel nanopowder over a range of co-firing oxygen partial pressures. Nearly independent of oxygen partial pressures, the thin film coated nickel nanoparticles demonstrated ability for repeatable dielectric constant with ultra-low dielectric loss, without modifying the dielectric powders themselves. This invention can ultimately allow for fast co-firing steps to be carried out in air, and allow thin film coated nickel or copper nanoparticles to supplant platinum and silver-palladium used in air firing steps today. This test also showed that even in samples with limited agglomeration due to the coating process, the performance of mildly agglomerated thin film coated nickel nanoparticles remains suitable for electrode applications.
Figure 8:
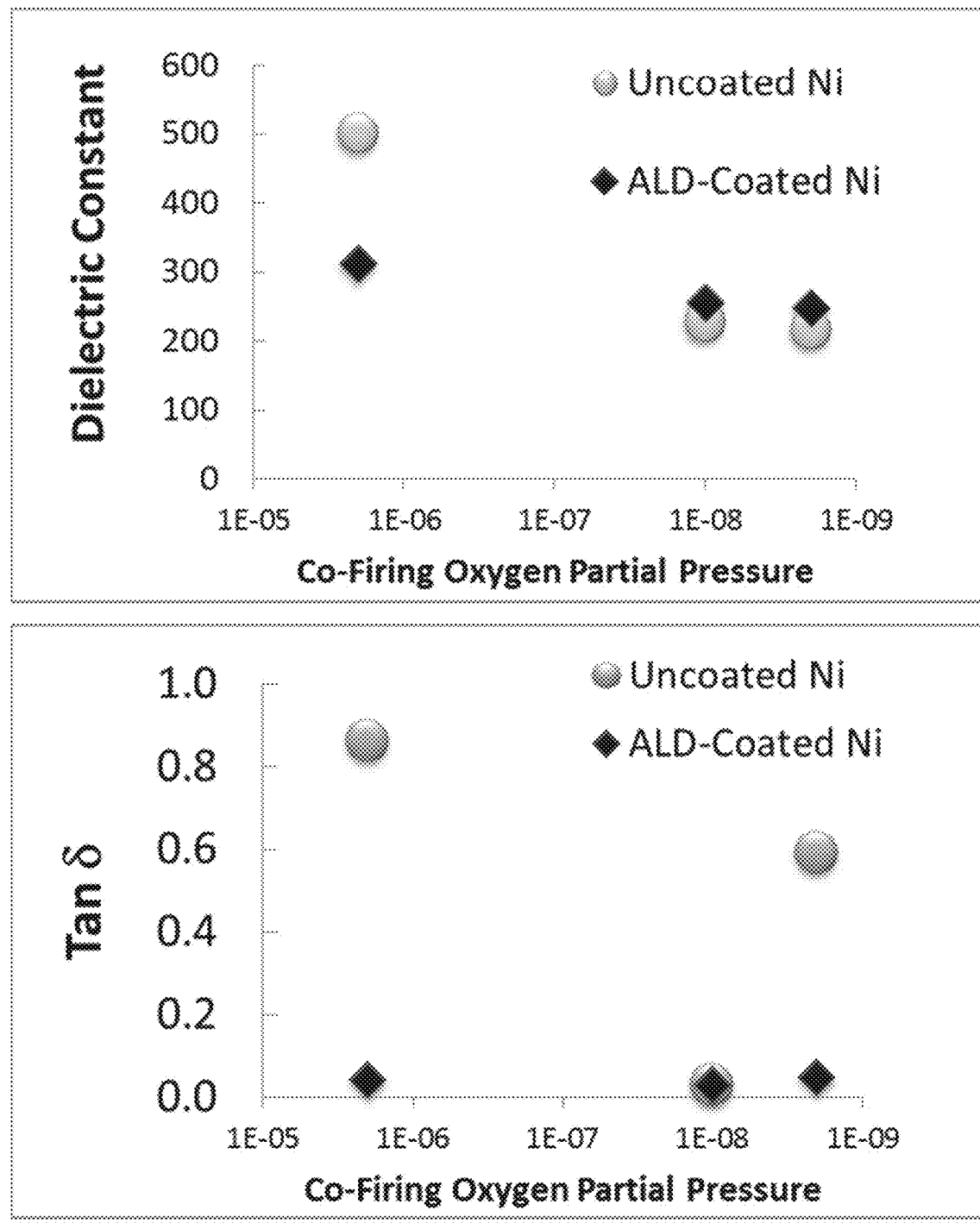
FIG. 8—Dielectric constant and loss (tan delta) measurements for alkali niobate-nickel nanopowder co-fired capacitors produced with uncoated and coated nickel nanopowder over a range of co-firing oxygen partial pressures; raw data from FIG. 7.
Figure 9:
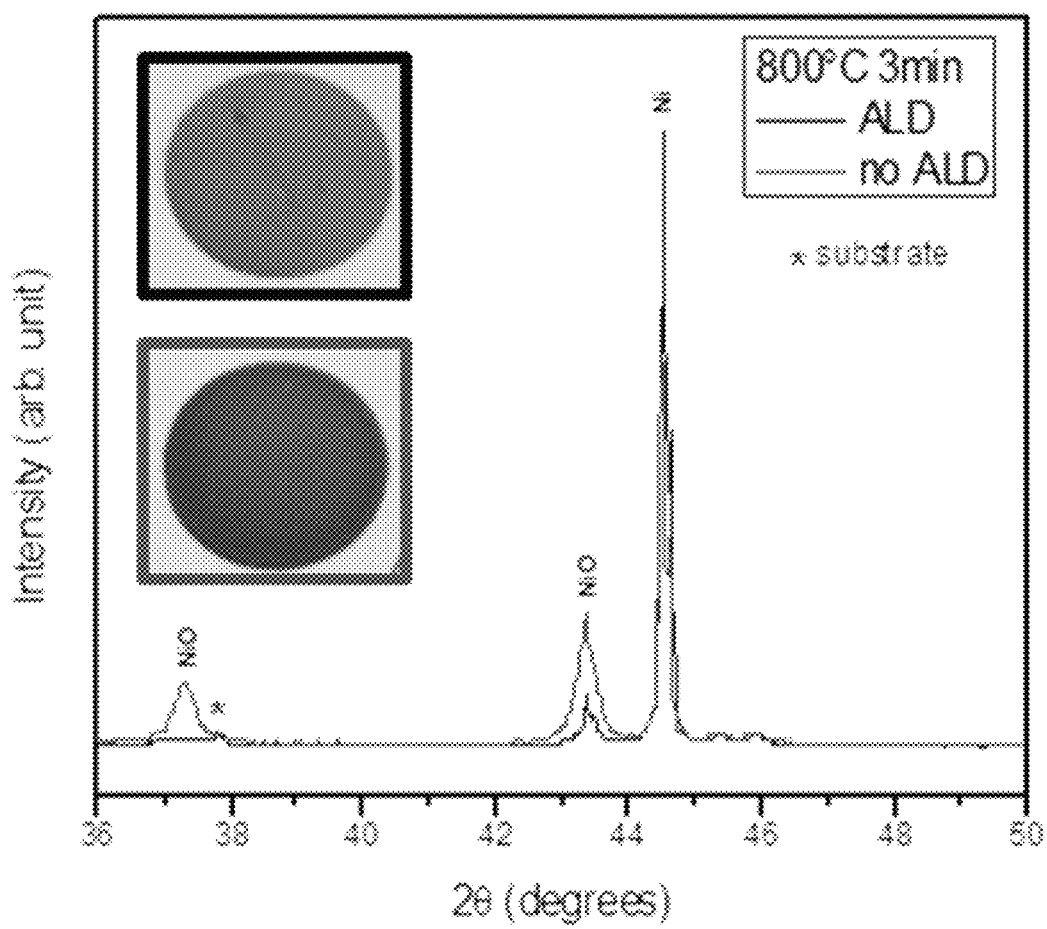
FIG. 9—Comparison of XRD data for Ni and NiO for coated and uncoated Ni Powders Fired in Air in an Elevator Kiln showing negligible NiO in the ALD coated case. Images of Nickel ink samples after firing @ 800° C./3 min (inset) are shown, with the outline color matching the colors on the XRD spectra legend. This data suggests that ALD coatings are much more robust to thermal shock than originally anticipated. Those skilled in the art have attributed the oxidation of nanocoated metal powders to film cracking allowing oxygen ingress, when viewing TGA data shown in FIG. 5 at a temperature ramp rate of 10° C./min; however an unexpectedly greater thermal stability has been demonstrated for this ~250° C./min thermal shock. The cooling time was substantial enough that the material remained above 300° C. for long enough that additional oxidation would have been rampant for grossly cracked films, and this was not the case.

Electronic devices have become ubiquitous in today's society. As modern electronic devices have become smaller, their components have also become smaller. In fact, some components of modern electronic devices are micro-scales. As these electronic components become smaller, they are more susceptible to degradation or oxidation, which significantly reduces the life of modern electronic devices. Electronic devices contain both active and passive electronic components. The term "passive electronic components" refers to components of electronic devices that can't introduce net energy into the circuit. Exemplary passive electronic components include, but are not limited to, two-terminal components such as resistors, capacitors, inductors, and transformers. In general, passive electronic components can't rely on a source of power, except for what is typically available from the circuit they are connected to. Thus, passive electronic components can't amplify (e.g., increase the power of a signal), but they may increase a voltage or current (e.g., as is done by a transformer or resonant circuit).

While present invention relates to a thin film coated nanoparticles that are used in various passive electronic components, for the sake of brevity and clarity the present invention will now be described in reference to capacitors. However, it should be appreciated that the scope of the invention includes thin film coated nanoparticles that are used in other passive electronic components such as resistors, inductors, and transformers. Moreover, methods disclosed herein can be used to produce such other passive electronic components. As mentioned hereinabove, energy storage device is an electronic device which benefits from such passive electronic components which include thin film coated nanoparticles or particles up to the size of the active material particles, or sometimes sized appropriately to fit between and/or within the void spaces amongst loosely or tightly packed active material particles. Examples of such energy storage devices include electrochemical systems such as batteries, capacitors (e.g., single-layer capacitors, multi-layer capacitors and ultracapacitors), fuel cells, electrochemical capacitors, and combinations thereof including hybrid capacitors, lithium-ion capacitors and lithium-air batteries. Examples of batteries include lead-acid, nickel metal hydride, alkaline, lithium metal, lithium ion, solid state electrolyte batteries, lithium polymer, sodium ion, magnesium ion, aluminum ion, lithium sulfur, sodium silicon, and similar systems known to one of ordinary skill in the art. Lithium ion batteries are one such example of an energy storage device, which are used as portable energy source for many electronic devices due to their high power and energy density as well as long shelf life. There is an industrial interest in increasing the energy density of lithium ion batteries, as a way to reduce the cost per energy unit of these batteries, to increase the consumer adoption of electric devices, including electric vehicles and portable electronics.

Today, MLCCs are most efficiently manufactured through the casting of alternating layers of inks/pastes consisting of electrode powders and dielectric powders, stacked in direct contact with one another, and after which binder burn-out and co-firing (e.g., sintering) steps are executed on assembled systems. Exemplary processing techniques are described by Imanaka ("Multilayered Low Temperature Co-fired Ceramics Technology", Springer, 2005) and by Nakano et al. (U.S. Pat. No. 7,595,974), which are incorporated herein by reference in their entirety.

There is an industry need to supplant the use of silver, platinum, palladium, and other costly precious metals used in electrode inks/pastes with base metals having one or more protective oxidation barrier coatings. Adopting suitable methods of supplanting expensive materials for low-cost base metals that achieve the same level of application functionality will significantly reduce the cost of MLCCs and other advanced power electronics devices. Hakim et al. ("Synthesis of oxidation-resistant metal nanoparticles via atomic layer deposition" *Nanotechnology* 29 (2007) 345603-345609) discusses how ALD can be used to encapsulate base metal particles, and extend their oxidation onset temperature by hundreds of degrees Celsius. Furthermore, ultrafine base metal powders can be produced via metal oxalate decomposition as described by Dunmead et al. (U.S. Pat. No. 6,689,191). Those skilled in the art have claimed that the oxidation onset temperature is driven by film cracking, however the present thin film coated nanoparticles can be thermally treated above this oxidation onset temperature during fast-firing steps without substantial oxidation as would be anticipated from films that crack at the oxidation onset temperature as measured using slow heating rates.

It is unexpected, however, that when producing insulator-coated electrode powders using ALD, that these composite particles (e.g., $BaTiO_3$—Ni MLCCs with co-fired inner electrodes) can function as well as pristine base metal electrode powders used today. Especially in light of U.S. Pat. No. 7,132,697, issued to Weimer et al. (the "Weimer et al. Patent"), discussing that ALD coated metal particles of 10 nm to 500 µm in diameter, with insulating coatings of 0.25 nm-500 nm in thickness, demonstrated non-linear resistivity with respect to film thickness. This patent implicitly appears to teach that metal particles coated with insulating metal oxide coatings deposited using ALD cannot serve as a drop-in replacement to uncoated particles in many other passive component applications such as capacitors and conductors.

In contrast to these teachings, the present inventors have discovered that the incorporation of 2-5 nm $Al_2O_3$ ALD coated submicron metallic Ni particles (600 nm and smaller) results in no significant additional resistivity even when operating at voltages below the accepted breakdown strength of bulk aluminum oxide. In some embodiments, metallic nickel particles are subjected to native oxide removal pretreatments prior to coating. The resulting ALD-coated metallic nickel particles can be used to either fully or partially supplant uncoated Ni particles (or the corresponding Ag, Pt and other common electrode materials). Similarly, ALD-coated metallic copper particles can be used to either fully or partially supplant uncoated Cu particles (or the corresponding Ag, Pt and other common electrode materials). Accordingly, some aspects of the invention provide a single-layer ceramic capacitor and/or MLCCs that yields no significant additional resistivity due to the coatings relative to the base metal itself. As used herein, the term "no significant additional resistivity" refers to a resistivity of an ALD-coated base metal nanoparticle, which first has its native oxide removed prior to coating, whose resistivity differs from the resistivity of uncoated base metal nanoparticle of same composition with its native oxide intact, by no more than about 20%, typically no more than about 10%, and often no more than about 5%. In some embodiments, the thin film of oxidation-resistant material provides no significant additional resistivity to said nanoparticles. Moreover, it has been discovered by the present inventors that a wide variety of core materials or particles such as nanoparticles that can be used in passive electronic components can be coated with a thin film of protective material. As used herein, the term "nanoparticles" refers to particles having average or median particle size of 1,000 nm or less, typically 500 nm or less, often 400 nm or less, and most often 250 nm or less. Alternative, the term "nanoparticles" refers to particles in which 80% or more, typically 90% or more and often 95% or more of the particles have the particle size of 1,000 nm or less, typically 800 nm or less, and often 600 nm or less. As used herein, the term "thin film" refers to a film or a coating of a material having mean or median thickness of about 20 nm or less, typically 10 nm or less, often 5 nm or less, and most often 3 nm or less. The term "base material" refers to the core material or nanoparticles of the invention. The term "coating" or "shell" is sometimes used to describe a thin film of material that covers the nanoparticles or the core material. It should be appreciated that the nanoparticle material and the thin film of coating are typically composed of different materials. As described in the Weimer et al. patent, suitable conductive core materials have resistivities in the range from about $10^{-1}$ to about $10^{-6}$ ohms/cm. Examples of such materials include metals such as copper, aluminum, nickel (including carbonyl nickel) molybdenum, silver, gold, zinc, cadmium, iron, tin, beryllium and lead; alloys of one or more of the foregoing metals, steel, bronze, brass and Mu-metal; various carbides such as titanium carbide, columbian carbide, tantalum carbide, tungsten carbide and zirconium carbide; and various metal silicides such as described in *Silicides for VLSI Applications*, S. P. Murarka (Academic Press, 1983), pp. 30-31. The conductive core particle preferably has a somewhat rounded shape with few if any sharp or highly angular surfaces. Approximately spherical particles are preferred.

Surprisingly and unexpectedly, the present inventors have discovered that applying a conductive ALD coating (or a semiconducting coating with an electronic band gap that is less than the operating voltage) to the surface of a 3,000 nm base metal electrode powder (copper) that had native oxide remaining intact, resulted in non-conductive composite particles. This observed result is contrary to what is disclosed or implied in the Weimer et al. Patent, which describes "a non-conductive coating that is deposited on core conductive particles using atomic layer deposition methods." For example, one of the examples in the Weimer et al. Patent describes 5,000 nm diameter iron particles coated with 5.5 and 22 nm $Al_2O_3$ films. The Weimer et al. Patent also identified the presence of an $Fe_2O_3$ native oxide interlayer (a commonly known insulator) at the interface between the innermost surface of the coating and the outermost surface of the core particle. Elsewhere, Weimer et al. have published that 7.5 nm-22 nm coatings on micron-sized Nickel powder demonstrated a similar nonlinear resistivity to the coated iron described in the Weimer et al. Patent. See, "Ultrafast metal-insulator varistors based on tunable $Al_2O_3$ tunnel junctions" *Applied Physics Letters* 92, (2008) 164101. However, no mention was made in this work as to whether the native oxide remained intact at the surface or if pretreatment steps were utilized to remove the native oxide. The Weimer et al. Patent implies that the insulating $Al_2O_3$ coating is the exclusive feature of their invention that provides non-linear resistivity with film thickness, while neglecting the contribution of the native oxide, which is also commonly known to be an insulator. There is an implicit presumption that the uncoated core conductive particles used for the study were tested in the same manner as the coated particles, however no data is presented for the 5,000 nm diameter iron particles with a native $Fe_2O_3$ layer, nor is any particle size smaller than 5,000 nm described. More importantly, it is well known to those skilled in the art of producing electronic components from powdered materials or inks containing powdered materials that there is a strong non-linear resistivity with respect to pressure. The Weimer et al. Patent does not discuss pressure; the publication however offers that the materials were placed in a centrifuge, and it is implicitly understood to be subject to a very high compaction pressure. This matrix of particles produced and tested is entirely different from how conventional passive electronics components such as conductors and capacitors are produced, specifically using an electrode layer produced through the printing of a particle-containing ink. Most surprisingly to the inventors was the discovery that conductive particles of 1,000 nm and smaller, first having the native oxide removed, and second having a coating process in which a thin (typically 2-6 nm) insulating ALD film was applied, was particularly useful as a conductive electrode powder for passive electronics components consisting of layers of electrode powders produced using conventional ink printing technologies, and moreover that these materials could be drop-in replacements for conductive electrode powders that did not have a thin film coating.

One difficulty faced when dealing with fine metal powders, especially submicron powders, is their propensity to form native oxide films in the presence of air and moisture, even at standard temperatures and pressures. For example, in the examples discussed above by Weimer et al., ALD-coated 5 micron metallic iron particles showed the presence of iron oxide at the interface between the particle and coating. It is well known to one skilled in the art that steps to remove this native oxide prior to coating can significantly improve the quality of the coated metal powders and their suitability for use in particular applications. Processes for removing native oxides are well known to one skilled in the art. For example, gas-solid contacting steps, in which metal particles are exposed to reducing gases at elevated temperatures, are oftentimes suitable in reducing the oxidation state of core materials, promoting oxygen vacancies, and/or promoting other beneficial phenomena. Similar reducing gas (e.g., "forming gas") exposures (sometimes referred to as protonation pretreatment steps) have been successful in improving properties of dielectric materials such as $BaTiO_3$. As is the case with pristine (i.e., substantially pure or a purity of at least 95%, typically at least 98% often at least 99%, and more of the at least 99.5%) metals that have higher surface energy than their native oxide coated counterparts, there is a strong likelihood that ultrafine metallic particles will permanently sinter or otherwise agglomerate if adjacent particles with reduced surfaces are allowed to come in contact with one another for extended periods of time during reduction steps in elevated temperature. Coatings have proven to be useful in preventing inter-particle sintering. In general, coating can prevent sintering entirely compared to uncoated particles that undergo sintering under similar conditions. In some instances, coating allowed a significant reduction in sintering as evidenced by requiring prolonged time and/or sintering temperature. In some cases, coating a particle increased sintering temperature as much as 200° C. to 300° C. compared to uncoated particles under similar conditions.

Some aspects of the invention, therefore, provide a metallic particle comprising a continuous nanoscale coated oxidation-resistant and electric conducting film. In some embodiments, the coating is an ultrathin coating consisting of a single to a plurality of atomic layer coatings. In one particular embodiment, the coating is an aluminum oxide coating. The particle size of the metallic particle, prior to coating, is typically from about 50 nm to about 3,000 nm, often from about 80 nm to about 1,000 nm, and most often from about 100 nm to about 600 nm. Typically, the "base material" comprises nanoparticles. In some embodiments, the electrically-conductive particle described herein may have a median particle size of 3,000 nanometers or less, for example from about 50 nm to about 3,000 nm, often from about 80 nm to about 1,000 nm, and most often from about 100 nm to about 600 nm.

As stated above, compositions of the invention can be used in a wide variety of passive electronic components including in conductors, transducers, actuators, piezoelectrics, transistors, thyristors, and capacitors. Methods and compositions of the invention can also be used in conductor-coated metals as core-shell electrode powders. Providing a coating of thin film as described herein provides a wide variety of beneficial effects including, but not limited to, limiting agglomeration during coating process and still achieve results, i.e., maintain substantially the similar electric conductivity and/or resistivity. Molecular layer deposition (MLD) process coated particles generally can be calcined to allow the coating shells to become porous and allow for forming-gas reduction of metals while preventing metals from sintering, i.e., enabling native oxide removal without sintering. An exemplary MLD process includes the in situ production of these materials by coating MLD films on metal oxalate particles, then decomposing the metal oxalate and making MLD porous in single process. Methods of the invention can be used to also produce core-shell magnetic materials, i.e., magnetic nanoparticles that are coated with a thin film of non-magnetic "shell".

Compositions of the invention can also be used to produce improved electrode layers by printing, spraying or other means to achieve ultrathin layers for MLCCs, single-layer capacitors, batteries, ultra-capacitors, etc. For example, compositions of the invention can be used to emulate a "three dimensional current collector" which is utilized in lithium ion batteries to reduce the thickness of the foils of the cells, and/or reduce the amount of certain conductive additive species, and/or increase the internal electrical conductivity of electrodes and consequently allow for thicker electrodes and substantially increase the energy density of batteries or allow for the battery to be extremely compact. Using the compositions of the invention to produce a three dimensional structure or network of highly conductive electrical pathways can allow for thicker active energy storage device components such as electrodes, and enable thinner, lower cost passive energy storage device components such as current collectors, separators, and other ion channels. The protective features of the ALD coatings can be used for high conductivity metallic or polymeric materials, or conventional carbon-based conductive materials or additives, imparting similar interfacial stabilization benefits without adversely impacting the role of function of the substrates in the device. Since battery electrodes require electronic conductivity to effectively stimulate the transport of electrochemically active ions throughout an electrode thickness, an object of the invention is to allow for thicker electrodes (thereby increasing energy density) to be produced without sacrificing the electrical network. In this manner, an electrode with, for example, a 90% active material loading, can be processed at 2× the conventional thickness and achieve the same lifetime as the baseline electrode of the conventional thickness. The alternative method of increasing energy density is to increase the active loading from 90% to 95%, 96%, 97%, 98% and sometimes 98.5%, by reducing the amount of binder and conductive additive. In some circumstances an electrically-conductive secondary phase with binder-like properties can be applied to the surfaces of the active materials, in such a way that the coated active materials comprise 100% of the electrode. However, generally, at some point a critical maximum electrode thickness is typically reached for each active material loading increase, which shrinks with reduced conductive additive. The ALD-coated conductive particles used in this invention allow for an increase in energy density of a finished battery by 10%, oftentimes 25%, sometimes 35%, and occasionally 50%, depending on the particular design of the electrodes and cells, as well as the selection of the active and passive material components.

In one aspect, provided is an electrode layer for an energy storage device which includes active and passive components. The electrode layer includes passive, electrically-conductive particles coated with a thin film of protective material. In at least one embodiment, the function of the said electrode layer is substantially the same to a similar electrode layer of passive, electrically-conductive particles in the absence of the protective material.

Suitable passive, electrically-conductive particles may include metallic or polymeric materials. Exemplary metallic and/or polymeric materials include, but are not limited to, aluminum, platinum, silver, gold, titanium, copper, zinc, chromium, nickel, iron, molybdenum, tungsten, ruthenium, palladium, indium, PtNi, FeCrAlY, AgPd, nichrome, other conductive steels, PEDOT, carbons, carbon black, acetylene black, activated carbon, carbon nanotubes, carbon fibers, vapor grown carbon fibers, carbon nanoribbons, graphite, graphene, diamond or diamond like carbon, and other conductive polymers, and the like or combinations thereof. In at least one embodiment, the passive, electrically-conductive particles include carbons, graphite, graphene, diamond or diamond like carbon.

Suitable methods for depositing the thin film on the electrically-conductive particles or for producing the thin film are described herein. Such methods may include, but are not limited to, atomic layer deposition, molecular layer deposition, chemical vapor deposition, or combinations thereof. The electrode layer may be suitably produced from a casting, printing or spraying process.

In another aspect, provided is an energy storage device which includes an electrode layer having passive, electrically-conductive particles, as described herein. The electrically-conductive particles may include one or more of copper, nickel or aluminum, and may be coated with one or more thin film protective materials. The coating may be produced using methods described herein such as the atomic layer deposition or the molecular layer deposition process.

In yet another aspect, provided is an energy storage device which includes an electrode layer having one or more passive, electrically-conductive coatings having a resistivity value less than 10,000 µΩ-cm, produced using atomic layer deposition or molecular layer deposition.

As used herein, the term "improved" with respect to life-time refers to having increased life-time of the passive electronic components due to the coating of thin film on nanoparticles or thin film on electrically-conductive particles. Typically, the life-time of an electrode layer comprising coated particles according to the present technology is increased by at least 10% more, typically at least 25% more, and often at least 50% more, compared to an electrode layer with the similar (i.e., uncoated) particles. Alternatively, "improved" with respect to rate capability can refer to having an increased rate capability, as defined by the ratio between the achievable capacity during a 6 C (10 minute) charging or discharging step, versus a 1 C (1 hour) charging or discharging step, where the rate capability of an electrode layer comprising coated particles is at least 10% more, typically at least 25% more, and often at least 50% more, compared to an electrode layer with the similar (i.e., uncoated) particles or one that uses conventional carbon-based conductive particles alone. Sometimes the rate capability ratio can be defined as the 1 C rate capacity divided by the 0.1 C, 0.5 C or 0.2 C rate capacity; other times the rate capability ratio can be defined as the 2 C, 3 C or 4 C rate capacity divided by the 1 C rate capacity. In all cases, the rate capability will be a percentage between 0 and 100%, and an improved rate capability will be signified by a percentage that is larger than its baseline percentage.

Some compositions of the invention include ceramic-coated dielectric particles. Typically, the atomic layer deposition (ALD) process is used to produce core-shell dielectrics. As used herein, unless the context requires otherwise the term "core" refers to the nanoparticles and the term "shell" refers to the thin film coating on the nanoparticles. In some cases, the presence of thin film coating improves or prevents ion mobility in dielectric nanoparticles. In other instances, the thin film coating can be used to manipulate or affect the final particle size, e.g., after firing or heating.

Some compositions of the invention include conductive ALD coatings applied directly onto the active material components of an energy storage device. In these compositions as they pertain to batteries, ALD is used to deposit a conductive coating (films or nanoparticles) around cathode and/or anode particles, which can achieve two goals: reduce or remove the need for a separate/discrete phase of conductive additive particles, and reduce the required thickness of, or in extreme cases remove the need for, a foil current collector, a binder or a conductive additive. An exemplary cathode material may include a lithium nickel manganese cobalt oxide, coated with, amongst other potential materials, nanoparticles of a conductive metal that can reduce the amount of separate conductive additive required, and/or a conductive polymeric coating that can reduce the amount of separate binder required to achieve/maintain a proper level of adhesion between the electrode and the current collector. In these cases, the ALD coatings may have a bifunctional effect of providing a stabilizing effect or improving the safety of the active materials independent of electrode design, while enabling an electrode design that is substantially thicker without adversely affecting the already provided stability and safety effect. The net result is that the electrode thickness can be increased (increasing energy density), the active material content can be increased (increasing energy density), and current collector thicknesses can be decreased (increasing energy density and reducing costs). With the full adoption of the envisaged solutions within both cathode and anode, may allow for an increase in energy density of a finished battery by 20%, oftentimes 45%, sometimes 65%, and occasionally 80%, depending on the particular design of the electrodes and cells, as well as the selection of the active and passive material components.

A thin film coating present on the nanoparticles of the invention prevents sintering at high temperature, e.g., during forming gas reduction process. In some cases, the thin film coating, e.g., $SiO_2$ coating, is thin enough to be permeable to reducing gas such as hydrogen while preventing sintering of nanoparticles. In some instances, compositions of the invention include MLD-coated particles where the thin film coatings become porous ceramic oxides to allow gas flow. In such instances, a second coating of thin film can be applied, e.g., after heat treatment. In other instances, the second coating of thin film provides an impermeable dielectric layer.

The thin film of coating can be applied to nanoparticles using a batch process (see the Weimer et al. Patent), a semi-continuous process (see commonly assigned U.S. patent application Ser. No. 13/069,452, entitled "Semi-Continuous Vapor Deposition Process For The Manufacture of Coated Particles"), a continuous process (U.S. Patent Application Publication No. 20120009343), as well as variations thereof including plasma-enhanced processes, or a combination thereof.

Additional objects, advantages, and novel features of this invention will become apparent to those skilled in the art upon examination of the following examples thereof, which are not intended to be limiting. In the Examples, procedures that are constructively reduced to practice are described in the present tense, and procedures that have been carried out in the laboratory are set forth in the past tense.

EXAMPLES

Example 1: Metallic copper particles devoid of native copper oxide coating, with and without ALD encapsulation coatings, have been produced in a set of six trials, using two different copper substrates to compare and contrast coating processes: two trials utilized 1-5 micron copper powders that maintained a nanoscale native oxide of copper in the as-received state (substrate A); and two trials utilized the decomposition of a copper oxalate powder in a fluidized bed reactor (substrate B). For substrates A and B, the following processes were run:

(1) Forming gas exposure at elevated temperature (450° C.) for 60 minutes;
(2) The process of (1) followed by a 3 nm ALD coating of $Al_2O_3$; and
(3) A first coating of a 5 nm aluminum alkoxide layer via the Molecular Layer Deposition (MLD), which results in a mesoporous $Al_2O_3$ coating during an elevated temperature organic burn-out step. Subsequently the process of (2) was followed, inclusive of the process of (1) as described above.

For cases A-1 and B-1, particle size distributions were shifted to dramatically larger values, a clear indication that inter-particle sintering was rampant. The d50 particle size using the B substrate is typically smaller than the d50 particle size of a bulk micron-scale powder of the same metal. After being exposed to air for 24 hours, copper oxide was clearly observed using XRD. For cases A-2 and B-2, a similar shift in particle size occurred, as that aspect of the processing was identical, however the $Al_2O_3$ coatings prevented the oxidation of the underlying copper powders as copper oxide was not observed using XRD. For cases A-3 and B-3, the aluminum alkoxide converts to a porous $Al_2O_3$ shell during the forming gas treatment step, which allows for forming gas to directly contact the surface of the particles, and the reduction step can proceed to completion while only the outermost $Al_2O_3$ surfaces are in contact with one another within the particle bed. Upon completion of the forming gas reduction step, the $Al_2O_3$ ALD shell was applied. The 3 nm $Al_2O_3$ ALD coating was again sufficient to prevent the oxidation of copper particles upon exposure to air for 24 hours. The dramatic difference between A-3 and B-3, relative to the analogues seeing only processes 1 and 2, was that the particle size remained largely unchanged, aside from what is naturally expected when carrying out such intensive, sequential coating processes on particles in vacuum fluidized bed reactors with vastly different temperature processing steps.

Example 2: Barium titanate particles with and without ALD coatings were subject to protonation steps, or high temperature forming gas exposures. Uncoated barium titanate treated for 1 hour at 900° C. in forming gas (4% $H_2$ in $N_2$), produced a locally-sintered powder with particle size distribution shifted to significantly larger sizes. $Al_2O_3$ and $SiO_2$ ALD coatings were applied to pristine barium titanate particles as well, and in both cases after identical forming gas treatments, the nanoscale coatings were sufficient to prevent sintering-induced aggregation observed extensively with the uncoated materials. The $Al_2O_3$-coated barium titanate turned a deep blue color, perhaps evidence that aluminum doping and/or barium aluminate formation occurred. However with the glassy $SiO_2$ coating, the material turned dark gray only, while maintaining a uniform particle size distribution that was changed only due to the fluidized bed coating process itself. This set of coating trials elucidated the value of tailoring the sintering prevention coating for specific processes, in that hydrogen gas in the forming gas process could much more readily diffuse through the deposited $SiO_2$ ALD coatings than the deposited $Al_2O_3$ ALD coatings, while the effect of sintering prevention was maintained independent of these coating materials. The protonated $SiO_2$-coated barium titanate can then be overcoated using protective $Al_2O_3$ layers for a grain boundary barrier effect, additional $SiO_2$, $Li_2O$ or $B_2O_3$, layers to serve as fritting material, or other coatings depending on the desired purpose.

Example 3: ALD-coated submicron-sized nickel powders have been formulated into standard inks for producing MLCC inner electrode tapes, alongside tapes made from inks formulated using uncoated nickel powders. Prior to this formulation, it is advantageous to better understand and define the minimum critical coating thickness required to prevent base metal oxidation during the binder burnout process. This process is typically run at no higher than 270° C. for 12 hours in air; however it is highly desirable to increase the working temperature to 300° C. for 12 hours in air to reduce the residual carbon and impurities that are normally left behind after an incomplete binder burnout process at lower temperatures. The Ni and NiO content was measured on raw powders before and after this thermal treatment step in a standard tube furnace. The control sample prior to the binder burnout process had a NiO content of 0.1 wt % as measured using powder XRD. The heat treated control sample had a resulting NiO content of 16.6%; one heat treated ALD-coated sample that was coated below the critical thickness had a resulting NiO content of 10.5%. Thicker ALD-coated samples at or above the critical thickness had resulting NiO contents of 0.2% or 0.1%.

Example 4: The alkali niobate/nickel co-fired MLCC system is one of a select number of possible candidates for lead-free high temperature, high voltage, high reliability capacitors for high temperature power electronics (e.g., SiC-based ICs) that require 150° C.-300° C. device operation. Another such candidate is bismuth zinc titanate-barium titanate (BZT-BT) dielectric layers ideally paired with oxidation-resistant copper inner electrodes. MLCCs consisting of layers of coated (at the defined critical thickness) vs. uncoated inner (nickel) electrode tapes and tapes made from formulated pristine alkali niobate powders were each fabricated to test the hypothesis that passivated base metal electrodes could be used as drop-in replacements to pristine nickel powders for MLCC applications. Post binder burnout, it is common to vary the oxygen partial pressure during high temperature co-firing steps and measure the dielectric constant and dielectric loss (tan δ) of the system to optimize the co-firing process for any new materials. For a given cast tape thickness, the optimal results would be a controllable dielectric constant for the layer, and minimal loss.

Processes and procedures to modify or tailor the dielectric materials in the dielectric layer have demonstrated control over these variables, so the anticipated result of utilizing passivated Ni tapes relative to pristine tapes was that the dielectric properties of the system would be unchanged, but perhaps a higher voltage bias would be needed to utilize the capacitor devices if the teachings of nonlinear resistivity by Weimer et al. were accurate in submicron base metals and sub 5 nm coating thicknesses. Two unexpected results were demonstrated by this test. First, the use of passivated inner electrodes did not require altering the electrical test conditions, likely suggesting that particles smaller than 1 micron in diameter and/or films thinner than 5 nm may not have been produced and evaluated by Weimer. Second, the use of ALD-coated inner electrode materials delivered a significant degree of robustness to the entire system with respect to a highly uniform and consistent dielectric constant with respect to co-firing oxygen partial pressure, and an incredibly low dielectric loss. This is the first demonstration of coated inner electrode materials paired with pristine dielectric materials that has delivered some of the same benefits as modifications to the dielectric materials themselves. The implications of this are broad and far-reaching, in that not only can ALD-coated inner electrodes be used to withstand operating conditions of next generation high temperature integrated circuit devices, but that relatively simple and low-cost metal coating steps can supplant the extensive and oftentimes complicated dielectric modification steps described herein. In addition, with better control over the dielectric properties of individual layers, the practical number of layers within ALD-incorporated MLCCs should be significantly larger than without using ALD-coated materials. This has a direct impact on the energy density attainable in MLCC devices.

The alkali niobate/nickel co-fired MLCC system was tested using tin oxide coated Ni to determine whether an insulator-metal composite particle was critical to affecting the dielectric properties of the system, or if a conductive coating could yield the same unexpected results. Other materials have also been coated on Ni, such as $SiO_2$, $B_2O_3$, $TiO_2$, $Ta_2O_5$, $Si_3N_4$, TiN and other metal oxides and nitrides commonly known to be applied using ALD techniques.

In order to further optimize the systems toward high temperature lead-free capacitors for demanding applications (e.g., DC Link capacitors), the previously described BZT-BT/Nickel and BZT-BT/Copper co-fired MLCC systems were tested with coated and uncoated electrode powders, and some variants included coatings and/or pretreatments to the dielectric materials themselves. Glassy coatings including $SiO_2$ and $B_2O_3$ may also be useful to improving the overall homogeneity of these co-fired systems.

Standard barium titanate/Ni co-fired MLCC systems were also tested with coated and uncoated electrode powders, and some variants included coatings and/or pretreatments to the dielectric materials themselves. Glassy coatings including $SiO_2$ and $B_2O_3$ were useful to improving the overall homogeneity of these co-fired systems.

Example 5: Plasma-enhanced atomic layer deposition (PE-ALD) coating techniques are commonly used to remove residual contaminants from incomplete surface reactions at lower operating temperatures. A PE-ALD TiN coated Ni electrode tape was produced along with a conventionally produced ALD TiN coated Ni electrode tape, to determine whether a change in residual contaminant (typically Cl from $TiCl_4$) level results in a higher electrical conductivity in a particle system, and whether this would affect the dielectric constant and loss to as great of a degree as an insulative coating or a less conductive coating. An exemplary demonstration is the production of TiN ALD coatings on particles, in which $TiCl_4$ and $NH_3$ can be administered in sequential fashion with HCl being the reaction product. Even at 400° C., there can be residual chlorine in the coatings, which makes the coatings materially different from TiN coatings devoid of contaminants. The TiN process for coating particles is identical to that demonstrated by Lakomaa in 1992 for $TiO_2$ (see "Atomic layer growth of $TiO_2$ on silica", *Applied Surface Science* 60/61 (1992) 742-748), except $NH_3$ replaces $H_2O$ in sequential self-limiting gas-solid contacting steps on particle surfaces in the bed of powder. Low temperature ALD processes using $TiCl_4$ and $H_2O$ can leave 2.0-10.0 wt % chlorine in the films. More recently, Elam et al. ("Surface chemistry and film growth during TiN atomic layer deposition using TDMAT and $NH_3$," *Thin Solid Films* 436 (2003) 145-156) disclosed a route to TiN ALD using tetrakis-dimethylamino titanium and ammonia, and even this precursor resulted in 2-5 wt % carbon in the film. The best films possessed a resistivity more than 600 times that of bulk TiN, which is unappealing for most conductive coating applications. TiN via thermal ALD typically has resistivity values>10,000 μΩ-cm, whereas Plasma-Enhanced TiN ALD typically has resistivity values<300 μΩ-cm. PE-ALD was used to deposit TiN onto Ni powders, which are then used as inner electrodes in MLCCs.

The surprising and unexpected discovery of the effect that co-fired ALD-coated inner electrodes have on MLCC devices is especially useful if the materials can be coated economically and at industrially-relevant rates. The submicron-sized Ni power described earlier was loaded into a semi-continuous ALD reactor as described by commonly assigned U.S. Patent Application Publication No. 2011/0236575, and passed through the system at high rates to determine the feasibility of mass production. The core material was passed through the semi-continuous counter-current flow system for the appropriate number of times to achieve the previously defined critical coating thickness for the material. The oxidation resistance of this material was identical to that produced in lab-scale fluidized bed reactors, however the throughput in the semi-continuous ALD reactor is ~200 times the throughput of batch systems, yet maintains a nearly equivalent footprint. These tests at both the small scale and large scale demonstrate the applicability of producing the composite materials in a large scale, and the ability to incorporate these compositions into conventional and high temperature MLCC devices, and applicability to a wide array of electronic components and devices that are fabricated using inks, pastes or tapes that include oxidation-resistant base metal electrode powders.

Example 6: The coated metallic copper particles of Substrate A and Substrate B produced in Example 1 were evaluated for suitability as a conductive additive into a battery electrode. Copper particles (1-5 micron and nano-sized) were coated using an atomic layer deposition process, where the coatings were confirmed to increase the oxidation onset temperature of each powder by at least 25° C. The powders were pre-blended with graphite powder and loaded into a slurry containing PVDF and NMP solvent, at a ratio of 90:5:5 and 80:15:5 for comparative evaluations (Graphite:Copper:PVDF), while baseline electrodes were produced using the same ratios, but using an uncoated carbon-based conductive additive in place of the copper. Each slurry was cast onto a copper current collector, at 10 mg/cm$^2$ and 20 mg/cm$^2$, in order to demonstrate the ability for the electrodes that incorporated the coated conductive metal particles to have longer life, especially with thicker electrode layers. Anode electrodes were paired with balanced NMC-based cathode electrodes at similar active loading amounts, using an uncoated carbon-based conductive additive. The 3-D current collector network of internal electrode powders was evaluated using charge-discharge cycling and impedance measurements before coating and after every 8 charge-discharge cycles.

The results of the anode trials are shown in Table 1, for the two different levels of additive loadings:

TABLE 1

Results of 3-D current collector network comprising copper for Li-ion battery anodes

| Metric | 5% Additive (90% Active, 5% PVDF) | | | 15% Additive (80% Active, 5% PVDF) | | |
| --- | --- | --- | --- | --- | --- | --- |
| | Pristine Carbon | Pristine Copper | ALD Copper | Pristine Carbon | Pristine Copper | ALD Copper |
| Init. 1 C Cap. (mAh/g) | 208.1 | 210.1 | 210.0 | 183.9 | 185.1 | 184.9 |
| Coulombic Efficiency | 87.2% | 88.9% | 88.7% | 87.1% | 88.8% | 88.9% |
| Delta Impedance: 24 cycles (ohms) | +15.8 | −7.0 | −6.8 | +13.1 | −9.3 | −8.8 |
| Cycle Life | 142 | 51 | 174 | 181 | 37 | 226 |
| 6 C Cap/1 C Cap | 68% | 92% | 88% | 76% | 91% | 93% |

Example 7: Coated metallic aluminum particles were evaluated for suitability as a conductive additive into a lithium-ion battery cathode. Aluminum particles (1-5 micron and nano-sized) were coated using an atomic layer deposition process, where the coatings were confirmed to increase the oxidation onset temperature of each powder by at least 25° C. The powders were pre-blended with a lithium nickel manganese cobalt oxide (NMC) powder and loaded into a slurry containing PVDF and NMP solvent, at a ratio of 90:5:5 and 80:15:5 for comparative evaluations (NMC:Aluminum:PVDF), while baseline electrodes were produced using the same ratios, but using an uncoated carbon-based conductive additive in place of the aluminum. Each slurry was cast onto an aluminum current collector, at 10 mg/cm$^2$ and 20 mg/cm$^2$, in order to demonstrate the ability for the electrodes that incorporated the coated conductive metal particles to have longer life, especially with thicker electrode layers. Cathode electrodes were paired with balanced graphite-based cathode electrodes at similar active loading amounts, using an uncoated carbon-based conductive additive. The 3-D current collector network of internal electrode powders was evaluated using charge-discharge cycling and impedance measurements before coating and after every 8 charge-discharge cycles. A similar effect on impedance was observed for the 3-D current collector for cathodes as was demonstrated in Table 1 for anodes. The first-cycle capacity was 1.5% and 1.6% higher for the uncoated aluminum and ALD-coated aluminum comprising cathodes, respectively, relative to the uncoated carbon-based additive baseline. For these samples, there was no substantial benefit or detriment to fast charge capability (as measured by 6 C versus 1 C charge rates), which suggests that the limitation to fast charging was within the anode for these particular electrodes.

Example 8: The coated metallic copper particles of Examples 1 and 6 were again deployed to fabricate an anode incorporating a powder-based 3-D current collector. In this trial, a bi-layer anode was produced to emulate a conductive additive gradient anode, wherein a layer comprising a conventional carbon-based conductive additive is positioned adjacent to the separator, and a layer comprising an ALD-coated copper-based conductive additive is positioned adjacent to the copper current collector. The powders were each pre-blended with graphite powder and loaded into a slurry containing PVDF and NMP solvent, at a ratio of 90:5:5 (Graphite:Copper:PVDF). First, the slurry comprising the copper additive was cast onto a copper current collector, at ~10 mg/cm$^2$ and allowed to dry in an inert environment overnight. Second, a slurry comprising the carbon-based additive was cast onto the dried copper additive-containing electrode also at a loading of ~10 mg/cm$^2$, in order to emulate a thicker electrode with a network of conductive additives that transitions from copper toward the copper current collector side, and conventional graphite toward the separator. Cathode electrodes were paired with balanced NMC-based cathode electrodes at similar active loading amounts (for the combined ~20 mg/cm$^2$ loading), using an uncoated carbon-based conductive additive. The 3-D current collector network of internal electrode powders was evaluated using charge-discharge cycling and impedance measurements before coating and after every 8 charge-discharge cycles. Interestingly enough, the measured 6 C/1 C ratio (one measurement of rate capability) for the ~20 mg/cm$^2$ loading of the bi-layer anode was within the experimental error to the rate capability for the ~10 mg/cm$^2$ baseline anode (that included a carbon-based conductive additive alone). These results suggest that the incorporation of an ALD-coated metallic powder can be an effective way to increase the rate capability of thickly-casted battery electrodes, while protecting the surfaces of these metals becomes increasingly important for materials positioned closer to the center of the battery (versus the extremes where the metallic current collector is already located. These results also emulate the potential benefits of using a coated current collector versus an uncoated current collector.

Example 9: The PE-ALD TiN process described in Example 5 is applied to lithium nickel manganese cobalt oxide (NMC) powders used as cathode materials, and natural graphite powders used as anode materials, in lithium ion batteries. The purpose of the coatings is to produce an electrically-conductive ceramic coating that acts as the three-dimensional current collector of the invention as applied to energy storage devices and batteries. Various coating thicknesses from 0.5 nm to 20 nm are applied to powder surfaces in a reactor configured for atomic layer deposition coatings described above. Of particular importance is the plasma-effect, which provides for highly conductive coatings on substrate interfaces, and minimizing the total mass required to be applied to overcome the localized percolation threshold for enhanced conductivity. ALD coatings of 1-5 nanometers applied to NMC powders and 2-10 nanometers applied to graphite powders, allow for increased electrode thicknesses by 15-40% for cathode electrodes, and 35-75% for anode electrodes, respectively.

Example 10: A copper ALD process, based upon an amidinate precursor, is applied to natural graphite powders used as anode materials in lithium ion batteries. The purpose of the coatings is similar to what is achieved in Example 9, to produce an electrically-conductive nanoparticulate metallic coating that acts as the three-dimensional current collector of the invention as applied to energy storage devices and batteries. Various coating thicknesses from 0.5 nm to 10 nm are applied to powder surfaces in a reactor configured for atomic layer deposition coatings described above. It has found that since the ALD copper alone can sometimes behave similarly (in certain electrode designs) to the uncoated copper loaded into the anode electrode in Example 6, a TiN ALD process applied in Example 9 can be further deployed as a copper ALD stabilization coating (0.5 to 2.5 nanometers is sufficient). A composite electrode comprising 96-98% active material coated with a first layer of copper and a second layer of TiN (remainder PVDF binder) can achieve a similar lifetime as an electrode comprising 90% active material, 5% conductive carbon additive and 5% PVDF binder.

Example 11: A copper ALD process, based upon an amidinate precursor, is again applied to natural graphite powders used as anode materials in lithium ion batteries. However instead of a conductive ceramic TiN ALD coating, the conductive polymer PEDOT is applied to the copper ALD coated active materials. PEDOT coatings ranging from 3 nm to 35 nm are applied to Cu-coated graphite particles (with and without TiN ALD coatings), and assembled into electrodes that comprise 100% coated graphite particles— i.e. no separate conductive additive and no separate binder material. The energy density of these electrodes surpasses the attainable energy density of conventional electrodes by providing for the elimination of all non-active material phases within the electrode layer.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter. All references cited herein are incorporated by reference in their entirety.

What is claimed is:

1. A method of forming a component of a multilayered ceramic capacitor (MLCC), comprising:
   providing electrically-conducting particles;
   coating the electrically-conducting particles by atomic layer deposition (ALD) or molecular layer deposition (MLD) to form coated electrically-conducting particles;
   forming a stack of layers comprising:
   a plurality of layers comprising the coated electrically-conducting particles alternating with a plurality of layers comprising dielectric particles; and
   sintering the stack of layers to form the MLCC wherein the stack of layers comprises alternating electrically conducting and dielectric layers.

2. The method of claim 1 wherein the step of coating the electrically-conducting particles comprises coating the electrically-conducting particles by ALD or MLD in a fluidized bed reactor.

3. The method of claim 1 wherein the electrically-conducting particles are metallic.

4. The method of claim 3 wherein the electrically-conducting particles comprise aluminum, copper or nickel.

5. The method of claim 3 wherein the electrically-conducting particles comprise platinum, silver, gold, titanium, zinc, chromium, iron, molybdenum, tungsten, ruthenium, indium, or tin.

6. The method of claim 1 wherein the layers comprising the coated electrically-conducting particles sinters at a temperature of 200° C. to 300° C. higher than the temperature at which the electrically-conducting particles without the coating would sinter under otherwise identical conditions.

7. The method of claim 3 wherein the metallic particles comprise platinum or silver-palladium.

8. The method of claim 1 wherein the electrically-conducting particles have a median particle size in the range of from 50 nm to 3000 nm, and wherein the coating has a median thickness of 5 nm or less.

9. The method of claim 1 wherein the layers comprising the coated electrically-conducting particles contains from 95 wt % to 98.5 wt % of the electrically-conducting particles.

10. The method of claim 1 wherein the coated electrically-conducting particles comprise 100% of the layers comprising the coated electrically-conducting particles.

11. A MLCC formed by the method of claim 1.

12. An electronic device comprising the MLCC of claim 11.

13. The method of claim 1 wherein the coating on the coated electrically-conducting particles comprises $SiO_2$ or $B_2O_3$.

14. The method of claim 1 wherein the dielectric particles comprise alkali niobate, bismuth zinc titanate, or barium titanate.

15. The method of claim 1 wherein the coating on the coated electrically-conducting particles comprises a metal oxide or metal nitride applied by ALD.

16. The method of claim 1 wherein the coating on the coated electrically-conducting particles comprises $SiO_2$, $TiO_2$, $Ta_2O_5$, or TiN applied by ALD.

* * * * *